(12) United States Patent
Kuo

(10) Patent No.: US 6,417,053 B1
(45) Date of Patent: Jul. 9, 2002

(54) FABRICATION METHOD FOR A SILICON NITRIDE READ-ONLY MEMORY

(75) Inventor: Tung-Cheng Kuo, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/990,455

(22) Filed: Nov. 20, 2001

(51) Int. Cl.[7] .............................................. H01L 21/336
(52) U.S. Cl. ........................ 438/287; 438/292; 438/468
(58) Field of Search ................................. 438/216, 261, 438/287, 288, 292, 466, 468, 469, 954

(56) References Cited

U.S. PATENT DOCUMENTS 4,562,639 A * 1/1986 McElroy et al. ............ 438/292
4,874,711 A * 10/1989 Hughes et al. .............. 438/292
5,543,344 A * 8/1996 Hsu et al. ................... 438/466
5,643,816 A * 7/1997 Hsu et al. ................... 438/292

* cited by examiner

Primary Examiner—Chandra Chaudhari
(74) Attorney, Agent, or Firm—J.C. Patents

(57) ABSTRACT

A fabrication method for a silicon nitride read-only memory is described. A silicon nitride read-only memory and a grounding doped region are formed in the substrate. A contact is formed on the substrate. A metal protection line is also formed, wherein the metal protection line is electrically connected to the word line of the silicon nitride read-only memory. Moreover, the metal protection line is electrically connected the grounding doped region through the contact to conduct charges generated during the manufacturing process to the substrate. The resistance of the metal protection line is higher than that of the word line. A high current is then used to burn out the metal protection line after the formation of the metal interconnect on the substrate to ensure a normal function of the memory device.

18 Claims, 4 Drawing Sheets

FABRICATION METHOD FOR A SILICON NITRIDE READ-ONLY MEMORY

CROSS-REFERENCE TO RELATED APPLICATION

This application claims the priority benefit of Taiwan application serial no. 90126669, filed on Oct. 29, 2001.

BACKGROUND OF THE INVENTION

1. Field of Invention

The present invention relates to a fabrication method for a non-volatile memory. More particularly, the present invention relates to a fabrication method for a silicon nitride read-only memory (NROM).

2. Description of Related Art

Flash memory is an electrically erasable programmable read-only memory (EEPROM) that is widely used in computer and microprocessor systems for permanently storing information that are repeatedly read, written or erased. Moreover, flash memory can retain information even when power is interrupted.

A typical flash memory device is formed with a doped polysilicon floating gate and a control gate. The programming of a flash memory device is accomplished by applying an appropriate voltage to the source region, the drain region and the control gate, and causing electrons to travel from the source region through the channel to the drain region. A portion of the electrons would pass through the tunnel oxide barrier under the polysilicon floating gate to enter the floating gate. The electrons that pass into the floating gate are evenly distributed in the polysilicon floating gate layer. This phenomenon of electron passing through the tunnel oxide barrier into the polysilicon floating gate layer is known as the tunneling effect. In general, the erasure of a flash memory is achieved by means of Fowler-Nordheim tunneling. The mechanism for programming a flash memory, on the other hand, is usually accomplished by channel hot-electron injection. However, when defects were present in the tunnel oxide layer under the polysilicon floating gate layer, current leakage would easily occur to adversely affect the reliability of the device.

To resolve the current leakage problem in a flash memory device, a charge-trapping layer is conventionally used to replace the polysilicon floating gate. Typically, an EEPROM is formed with a stacked gate structure that comprises a silicon oxide/silicon nitride/silicon oxide layer structure, and the silicon nitride layer of the ONO structure serves as the charge-trapping layer. Because the silicon nitride charge-trapping layer functions as the floating gate of the read-only memory, this type of EEPROM is also known as silicon nitride read-only memory (NROM). Since the silicon nitride layer tends to trap charges, the electrons that are injected into the silicon nitride are not evenly distributed in the entire silicon nitride. Instead, the electrons are distributed in a Gaussian manner in the silicon nitride. Since the electrons injected into the silicon nitride are concentrated in a localized region, the presence of defect in the tunnel oxide layer is not as magnified. The current leakage problem in the device is thus mitigated.

Another advantage of having a silicon nitride layer to serve as the floating gate is because electrons are stored locally in the channel near the top of either the source region or the drain region. In other words, a NROM has the advantage for storing 2 bits of memory in a single cell. The programming of a NORM can accomplish by first applying voltages to the source region at the end of the stacked gate and to the control gate, and trapping electrons at the end of the stacked gate near the source region. Voltages can further be applied to the drain region at the other end of the stacked gate and to the control gate, and trapping electrons at the end of the stacked gate near the drain region. By applying voltages to the control gate and to the source region or drain region at the side of the stacked gate, two groups of electrons, a single group of electrons or no electron can be stored in the silicon nitride. Using silicon nitride as the floating gate for a flash memory device thus provides four types of configuration in a single memory cell and a 2-bit in one memory cell type of flash memory device.

During the fabrication of a silicon nitride read-only memory, plasma is often used in the process. The charges generated in plasma process would move along the metal interconnects. Such a phenomenon is known as the "antenna effect". When a transient charge unbalance occurs, a portion of the charges is injected into the ONO layer to induce a programming effect. A large threshold voltage variation, 0.3 volts to 0.9 volts, is thereby resulted.

A conventional approach to resolve the programming effect in a silicon nitride read-only memory resulted from the "antenna effect" is to form a diode in the substrate to electrically connect with the word line. When the transient charges reach a specific value, the device is discharged by an electrical breakdown of the diode. However, when the voltage induced by the charges is less than the breakdown voltage of the diode, the charges are still injected into the ONO layer to induce the programming effect. Moreover, such a design will lower the input voltage and decreases the speed of the writing operation.

SUMMARY OF THE INVENTION

The present invention provides a fabrication method for a silicon nitride read-only memory in which the charges generated during the manufacturing process are conducted to the substrate to prevent the silicon oxide/silicon nitride/ silicon oxide (ONO) composite layer of the non-volatile read-only memory from being damaged. The input voltage is not reduced to adversely affect the operational speed of the device when the memory device is being used.

The present invention provides a fabrication method for a silicon nitride read-only memory. The method includes sequentially forming a silicon nitride read-only memory, a grounding doped region and a contact in a substrate. A metal protection line is also formed, wherein the metal protection line is electrically connected to one of the word line of the silicon nitride read-only memory cell and is electrically connected to the grounding doped region through the contact. Moreover, the resistance of the metal protection line is higher than that of the word line. Subsequent to the manufacturing of a metal interconnect on the substrate, a large current is applied to burn out the metal protection line.

According to the present invention, the charges generated during the plasma-containing manufacturing process are conducted to the grounding doped region in the substrate through the metal protection line and the contact. The transient unbalance charges are thereby dissipated via the substrate to prevent the trapping of charges in the silicon oxide/silicon nitride/silicon oxide layer.

Moreover, the resistance of the metal protection line is higher than that of the word line, a high current can be used to burn out the metal protection line after the manufacturing process is completed. When the silicon nitride read-only memory device with a metal protection line is operating, the input voltage is not lower to slow the operating speed.

Accordingly, the charges generated during the fabrication process are conducted to the substrate to protect the silicon oxide/silicon nitride/silicon oxide composite layer of the non-volatile read-only memory from being damaged or programmed. Furthermore, a high current can be used to burn out the metal protection line after the manufacturing process is completed, allowing the read-only memory to operate normally.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
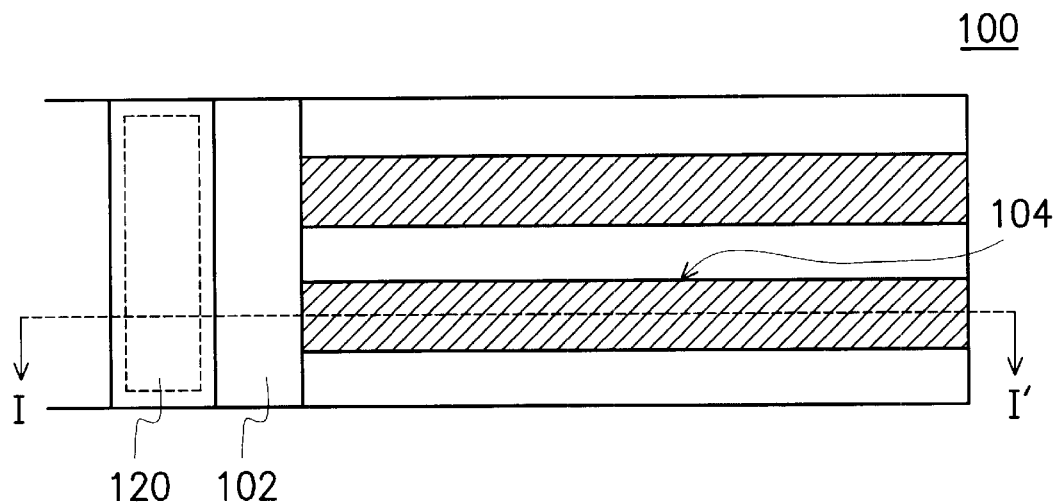
FIGS. 1A to 1C are top-view layouts, showing the manufacturing of a silicon nitride read-only memory according to a preferred embodiment of the present invention.
Figure 1B:
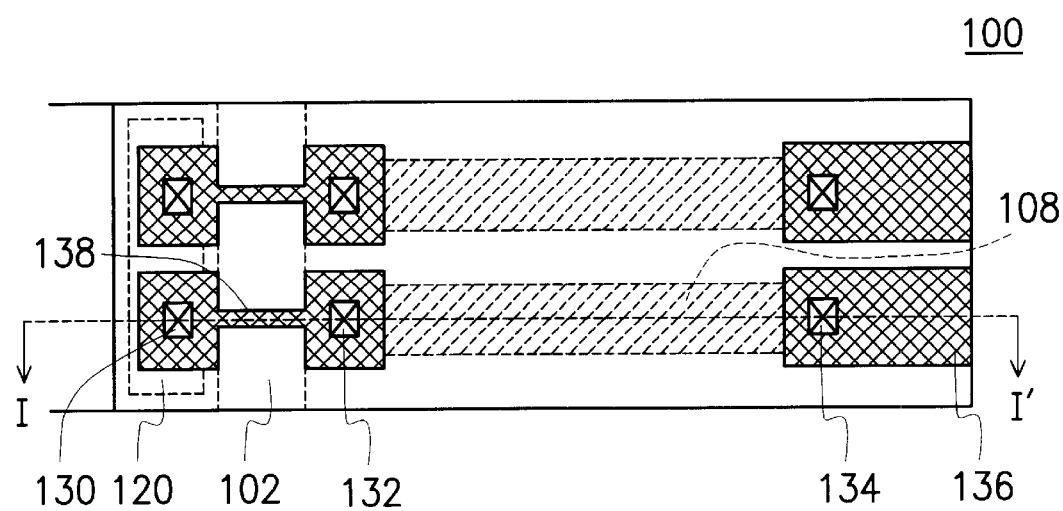
Figure 1C:
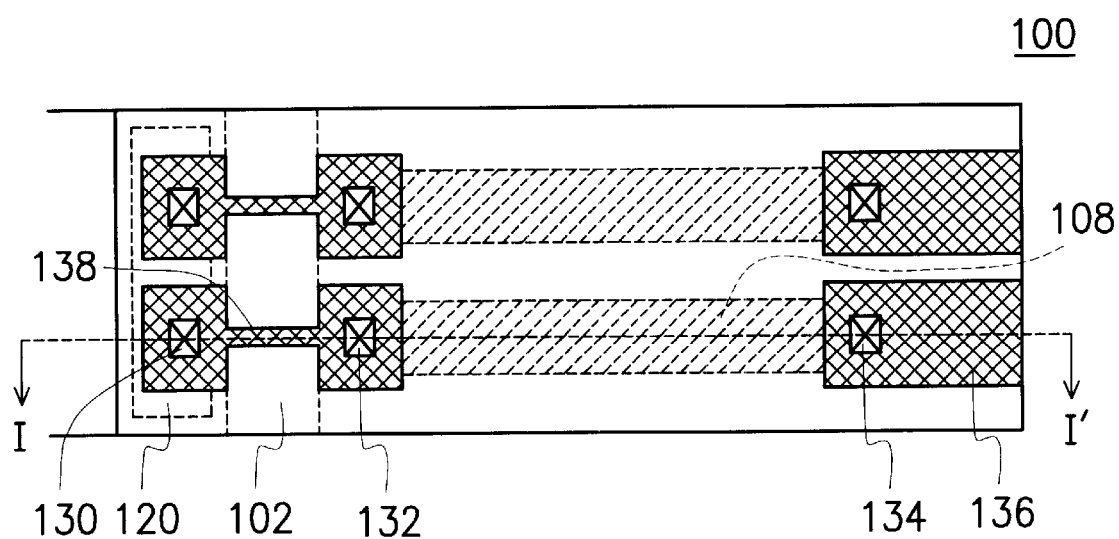
Figure 2A:
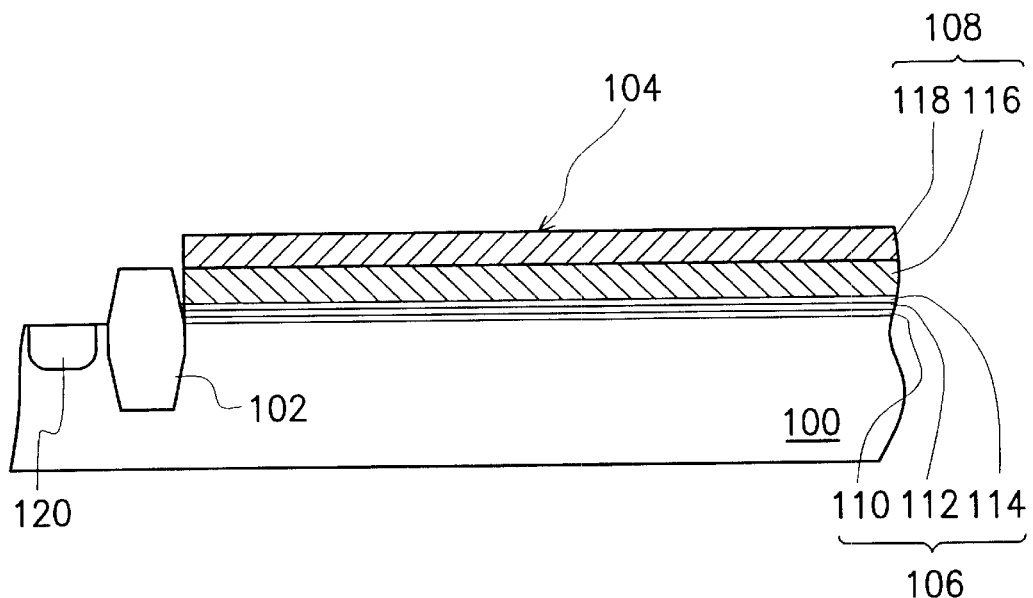
FIGS. 2A to 2C are perspective views of cutaway parts of the layout in FIGS. 1A to 1C.
Figure 2B:
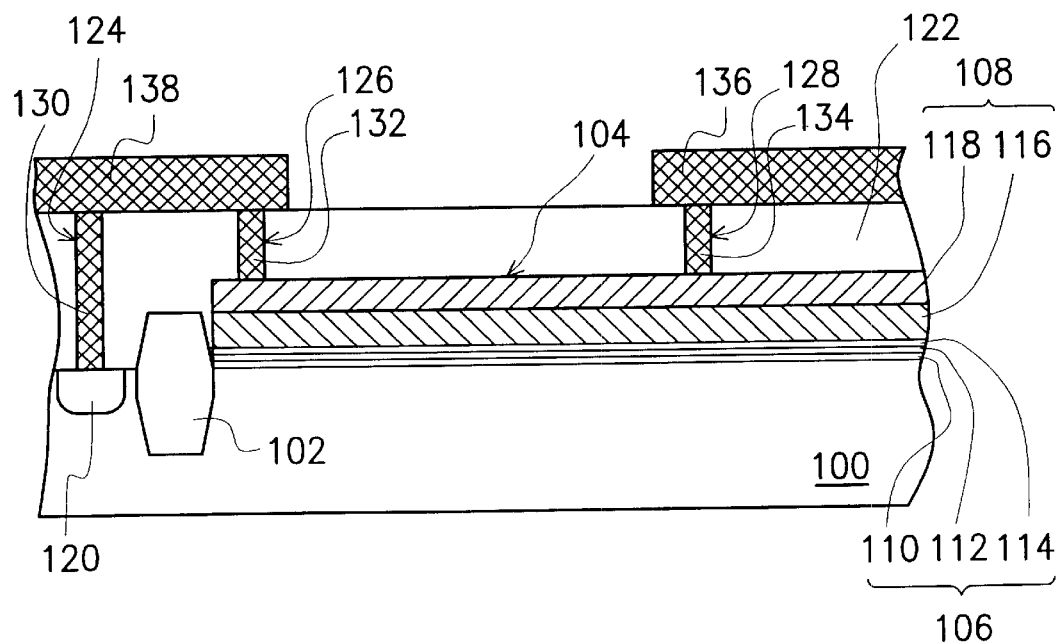
Figure 2C:
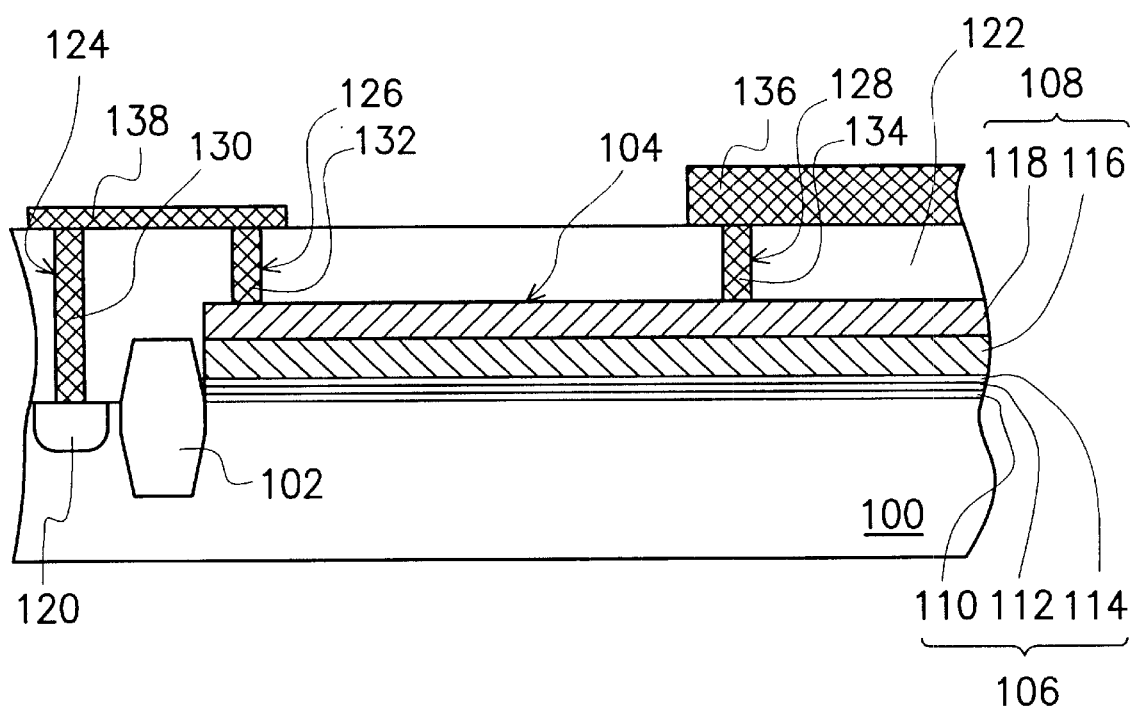

The preferred embodiment of the present invention discloses the fabrication of a silicon nitride read-only memory. FIGS. 1A to 1C and 2A to 2C illustrate concurrently the preferred embodiment of the present invention. FIGS. 1A to 1C are top-view layouts, showing the manufacturing of a silicon nitride read-only memory according to a preferred embodiment of the present invention. FIGS. 2A to 2C are perspective views of cutaway parts of the layouts in FIGS. 1A to 1C.

Referring to FIGS. 1A and 2A, a substrate 100, for example, a silicon substrate, is provided. Isolation regions 102 are formed in the substrate 100, wherein the isolation regions 102 are formed by, for example, local oxidation (LOCOS) or shallow trench isolation (STI).

Thereafter, a silicon nitride read-only memory cell 104 is formed on the substrate 100. This silicon nitride read-only memory cell 104 includes a layer of composite layer 106 and a gate conductive layer 108 on the composite layer 106. The composite layer 106 comprises a tunnel oxide layer 110, a silicon nitride layer 112 and a silicon oxide layer 114, which form a silicon oxide/silicon nitride/silicon oxide (ONO) structure. The composite layer 106 is formed by methods, such as chemical vapor deposition (CVD). The gate conductive layer 108 serves as the word line for the silicon nitride read-only memory. The gate conductive layer 108 includes a polycide layer. The gate conductive layer 108 is formed by, for example, forming a layer of doped polysilicon layer 116, followed by forming a metal silicide layer 118 on the polysilicon layer 116. The metal silicide layer 118 includes tungsten silicide. The doped polysilicon layer 116 is formed by, for example, chemical vapor deposition with in-situ doping. The metal silicide layer 118 is formed, for example, by low-pressure chemical vapor deposition using tungsten fluoride ($WF_6$) and silane as reacting gases.

A grounding doped region 120 is then formed in the substrate 100. The grounding doped region 120 is formed by, for example, forming a patterned photoresist layer (not shown in Figure) on the substrate 100, followed by implanting ions in the substrate 100 that is exposed by the patterned photoresist layer. The photoresist layer is then removed to complete the formation of the grounding doped region 120.

Continuing to FIG. 1B and FIG. 2B, a dielectric layer 122 is further formed on the substrate 100. The dielectric layer 122 includes silicon oxide, phosphosilicate glass, boron phosphosilicate glass, which is formed by methods, such as chemical vapor deposition. Photolithography and etching are used to form openings 124, 126 and 128 in the dielectric layer 122, wherein the opening 124 exposes a portion of the surface of the doped region 120. The openings 126 and 128 expose a portion of the surface of the metal silicide layer 118.

A conductive layer (not shown in Figure) is formed on the dielectric layer 122, filling the openings 124, 126, 128 to form contacts 130, 132, 134. The conductive layer includes materials that have a resistance higher than a metal silicide material. The conductive layer is formed by, for example, physical vapor deposition or chemical vapor deposition. Subsequent to the formation of the conductive layer, chemical mechanical polishing (CMP) is further conducted to planarize the conductive layer.

The conductive layer is then patterned by means of photolithography and etching to form the metal interconnect 136 and the metal protection line 138, wherein the metal interconnect 136 is electrically connected to the gate conductive layer 108 (word line) through the contact 134. The metal protection line 138 is electrically connected to the gate conductive layer 108 (word line) through the contact 132. The metal protection line 138 is also electrically connected to the grounding doped region 120 through the contact 130.

As shown in FIG. 1C and FIG. 2C, the thickness of the metal protection line 138 is reduced so that the metal protection line 138 is easily burnt out by a high current after the formation of the silicon nitride read-only memory cell is completed. Reducing the thickness of the metal protection line 138 includes forming a patterned photoresist layer (not shown in Figure), this patterned photoresist layer covers the metal interconnect 136 and exposes the metal protection line 138. An etching process is further conducted to remove a portion of the metal protection line 138 and to reduce the thickness of the metal protection line 138. Since the metal protection line 138 becomes thinner, the resistance of the metal protection lines 138 increases. A high current can be used to burn out the metal protection line 138.

According to the preferred embodiment of the present invention, the charges generated in the manufacturing process are conducted in the substrate 100 with the metal protection line 138. Therefore, even under a high pressure environment of a plasma manufacturing process, the generation of charges is minimized. Moreover, the generated charges are also conducted to the grounding doped region 120 in the substrate 100 through the contact 132, the metal protection line 138 and the contact 130. The transient unbalanced charges are dissipated via the substrate 100 to obviate the trapping of charges in the in the silicon oxide/silicon nitride/silicon oxide (ONO) composite layer.

Additionally, the resistance of the metal protection line 138 is higher than that of the word line 108. A high current can be used to burn out the metal protection line 138 after the completion of the fabrication process. The metal protection line 138 for the silicon nitride read-only memory of the present invention thus prevents a lowering of the input voltage and a retardation of the programming speed during the operation of the device.

Accordingly, a high resistance metal protection line is formed to connect the word line and the charges generated in the manufacturing process are thereby conducted to and dissipated via the substrate. The ONO layer used in the non-volatile memory is protected from being damaged and falsely programmed. Moreover, the metal protection line is burnt out with a high current after the completion of the fabrication process to ensure a normal function of the device. Moreover, the metal protection line is burnt out with a high current after the completion of the fabrication process to ensure a normal function of the device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a silicon nitride read-only memory, comprising:

forming a silicon nitride read-only memory cell on a substrate;

forming a grounding doped region in the substrate;

forming a contact on the substrate;

forming a meal protection line on the substrate, wherein the metal protection line electrically connects a word line of the silicon nitride read-only memory to the grounding doped region, and a resistance of the metal protection line is higher than that of the word line;

forming a metal interconnect on the substrate; and applying a high current to burn out the metal protection line, after the fabrication process is completed.

2. The method of claim 1, wherein the word line includes a tungsten silicide layer.

3. The method of claim 1, wherein forming the metal protection line on the substrate further includes forming a conductive layer on the substrate and the conductive layer and the word line of the silicon nitride read-only memory cell are electrically connected, and the conductive layer is electrically connected to the grounding doped region through the contact.

4. The method of claim 1, wherein forming the grounding doped region in the substrate further comprises:

forming a patterned photoresist layer to cover the silicon nitride read-only memory cell and to expose a part of the substrate;

implanting a dopant to the substrate exposed by the patterned photoreist layer; and removing the patterned photoresist layer.

5. The method of claim 1, wherein forming a silicon nitride read-only memory cell further comprises:

forming a composite layer on a substrate; and forming a gate conductive layer on the composite layer.

6. The method of claim 5, wherein the composite layer is formed with a tunnel oxide layer, a silicon nitride layer and a silicon oxide layer.

7. The method of claim 5, wherein the composite layer is formed by chemical vapor deposition.

8. The method of claim 5, wherein the gate conductive layer is formed with a doped polysilicon layer and a metal silicide layer.

9. The method of claim 5, wherein the gate conductive layer is formed by chemical vapor deposition.

10. A fabrication method for a silicon nitride read-only memory, comprising:

providing a substrate, and a silicon nitride read-only cell is already formed on the substrate;

forming a grounding doped region in the substrate;

forming a dielectric layer on the substrate;

patterning the dielectric layer to form a first opening, a second opening and a third opening, the first opening exposes a surface of the grounding doped region, the second opening and third opening expose a surface of a word line of the silicon nitride read-only memory cell;

forming a conductive layer on the substrate, filling the first opening, the second opening and the third opening with a conductive layer to form a first contact, a second contact and a third contact, and the conductive layer covers a surface of the dielectric layer;

patterning the conductive layer to form a metal protection line and a metal interconnect, the metal protection line is electrically connected to the grounding doped region and the silicon nitride read-only memory cell through the first contact and the second contact, respectively, and the metal interconnect is connected to the word line of the silicon nitride read-only through the third contact;

reducing a thickness of the metal protection line to increase the resistance of the metal protection line to be higher than that of the word line; and applying a high current to burn out the metal protection line, after the fabrication process is completed.

11. The method of claim 10, wherein the word line includes tungsten silicide.

12. The method of claim 10, wherein reducing the thickness of the metal protection line further comprises:

forming a patterned photoresist layer on the substrate and the patterned photoresist layer covers the metal interconnect and exposes the metal protection line; and etching a portion of the metal protection line to reduce the thickness of the metal protection line.

13. The method of claim 10, wherein forming a grounding doped region in the substrate further comprises:

forming a patterned photoresist layer to cover the silicon nitride read-only memory cell and to expose a portion of the substrate;

implanting ions to the portion of the substrate exposed by the patterned photoresist layer; and removing the patterned photoresist layer.

14. The method of claim 10, wherein forming the silicon nitride read-only memory cell on the substrate further comprises:

forming a composite dielectric layer; and forming a gate conductive layer on the composite layer.

15. The method of claim 14, wherein the composite dielectric layer is formed with a tunnel oxide layer, a silicon nitride layer and a silicon oxide layer.

16. The method of claim 14, wherein the composite layer is formed by chemical vapor deposition.

17. The method of claim 14, wherein the gate conductive layer is formed with a doped polysilicon layer and a metal silicide layer.

18. The method of claim 14, wherein the gate conductive layer is formed by chemical vapor deposition.

* * * * *